(12) United States Patent
Kang et al.

(10) Patent No.: US 7,776,493 B2
(45) Date of Patent: Aug. 17, 2010

(54) MASK FOR LITI AND LITI METHOD USING THE SAME

(75) Inventors: Tae-Min Kang, Suwon-si (KR); Jae-Ho Lee, Suwon-si (KR); Seong-Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1027 days.

(21) Appl. No.: 11/509,574

(22) Filed: Aug. 25, 2006

(65) Prior Publication Data
US 2007/0048436 A1 Mar. 1, 2007

(30) Foreign Application Priority Data
Aug. 25, 2005 (KR) .............. 10-2005-0078466

(51) Int. Cl.
*G03F 1/00* (2006.01)
(52) U.S. Cl. .......................................... 430/5
(58) Field of Classification Search .............. 430/5; 347/240, 251
See application file for complete search history.

(56) References Cited

U.S. PATENT DOCUMENTS

| 4,347,300 | A | 8/1982 | Shimazu et al. |
| 5,650,250 | A * | 7/1997 | Moon .................. 430/5 |
| 7,542,063 | B2 * | 6/2009 | Lee et al. ............ 347/241 |
| 2004/0133872 | A1 | 7/2004 | Fukuhara et al. |
| 2005/0024706 | A1 | 2/2005 | Gelbart |

FOREIGN PATENT DOCUMENTS

| EP | 0 432 608 A2 | 12/1990 |
| EP | 1 015 938 B1 | 12/2002 |
| EP | 1 441 572 B1 | 6/2006 |

* cited by examiner

*Primary Examiner*—Stephen Rosasco
(74) *Attorney, Agent, or Firm*—Stein McEwen, LLP

(57) ABSTRACT

A mask for LITI and a LITI method using the same wherein the mask includes patterns arranged in a direction perpendicular to a beam scanning direction and are arranged so that increasingly longer patterns are located towards the edge of the mask than in or near the center.

15 Claims, 9 Drawing Sheets

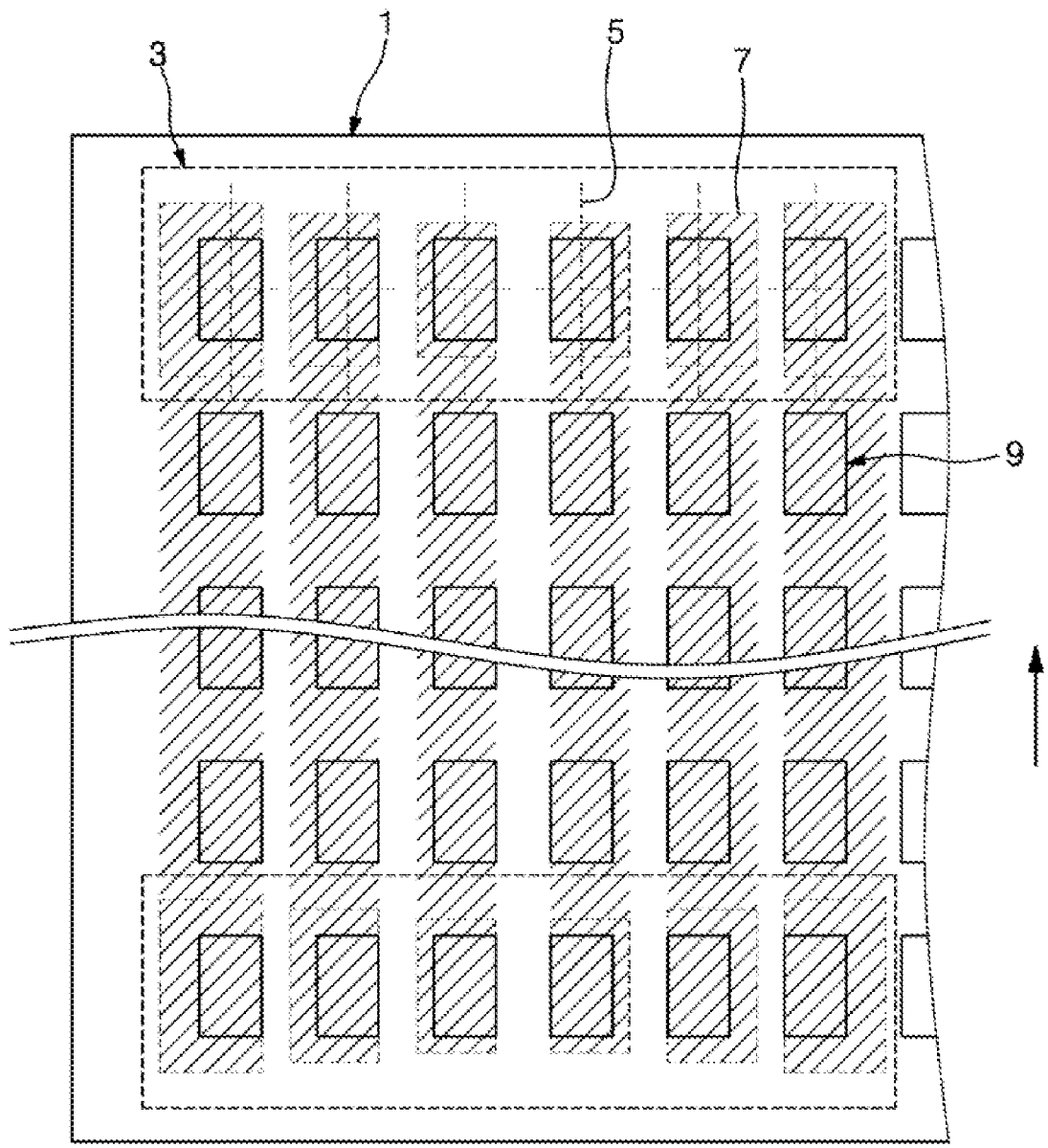

MASK FOR LITI AND LITI METHOD USING THE SAME

CROSS-REFERENCE TO RELATED APPLICATIONS

This application claims the benefit of Korean Application No. 2005-78466, filed Aug. 25, 2005 in the Korean Intellectual Property Office, the disclosure of which is incorporated herein by reference.

BACKGROUND OF THE INVENTION

1. Field of the Invention

Aspects of the present invention relate to a mask for laser induced thermal imaging (LITI) and a LITI method using the same, and more particularly, to a mask for LITI and a LITI method using the same, in which an output of an optical unit is uniform.

2. Description of the Related Art

Among flat panel displays, an organic light emitting display device has a relatively fast response time of 1 ms or less, and consumes relatively low power. Further, the organic light emitting display device emits light by itself, so that it can have a wide viewing angle regardless of its size. Thus, the organic light emitting display device has advantages as a display medium of moving images, such as videos. Further, the organic light emitting display device can be manufactured at low temperatures and by a simple process based on existing semiconductor process technology. Accordingly, the organic light emitting display device has attracted much attention as a next-generation flat panel display device.

An organic light emitting device used in the organic light emitting display device may be classified into a polymer device using a wet process and a small molecular device using a deposition process depending on utilized materials and processes. One method for patterning a polymer or small molecular emission layer is an inkjet-printing method that has limitations in the type of usable materials to form organic layers other than the emission layer and requires a complicated structure on a substrate for the ink. Another method for patterning is a deposition method where the emission layer is patterned by the deposition process, which requires use of a metal mask, which makes it difficult to manufacture a large-sized device.

Accordingly, laser induced thermal imaging (LITI) has recently been developed as an alternative to the above-described patterning methods.

The LITI transforms a beam of light output from a light source, such as a laser, into heat energy, and transfers a pattern-forming material to a target substrate using the heat energy to form a pattern. The LITI requires a donor substrate having a transfer layer, a light source, and a target substrate. In the LITI, the donor substrate and the target substrate are fixed on a stage while the donor substrate entirely covers the target substrate (i.e., a receptor substrate). Then, the LITI is applied to the donor substrate, thereby completing the patterning.

When the patterning is performed by a projection method using a mask, the mask has a predetermined pattern such as a rectangular pattern.

FIG. 1A is a graph showing pattern characteristics according to positions of a substrate with respect to a mask, FIG. 1B is a graph showing a power density of a laser beam relative to positions on a substrate, and FIG. 2 is a plan view of a patterned substrate of FIGS. 1A and 1B.

Referring to FIG. 1A, a position (x, y) of an image patterned on the substrate should be in a predetermined proportion to a position (v, y) of a mask (the dotted-line). That is, the patterns of the substrate should correspond to the pattern position (v, y) of the mask in a 1:1 ratio. Accordingly, the patterns on the substrate should be formed at regular intervals and have uniform shapes. However, the actual patterned image (the solid-line) may be distorted by a projection lens.

Referring to FIG. 2, comparing a center axis 5 of the mask patterns (not shown) with a pattern 7 on a substrate 1, the image of the pattern 7 on the substrate 1 becomes increasingly distorted in the pattern 7 located towards the edges of the mask 3. That is, the pattern 7 on the substrate 1 located near the edges has a center axis that is more distant from the center axis 5 of the mask patterns, and this effect becomes more pronounced as one moves from the center towards the edges of the mask 3. Thus, an emission region 9 near the edge of the substrate 1 may not be completely patterned even when one mask is utilized.

Referring to FIG. 1B, the power density of the laser beam should be constant the dotted-line) with regard to the position (x, y) of the pattern. However, the power density of the laser beam may not be uniform (the solid-line) because of the laser beam's uneven distribution and non-uniformity due to a deformation of the laser's projection lens. That is, patterns near the edge of the mask are scanned with less laser energy than patterns near the center. Therefore, the area of the substrate 1 corresponding to the edge patterns of the mask 3 may not be completely transferred, and those patterns 7 are likely to be broken and unclear, thereby distorting an image.

As described above, the distortion of the image causes a problem in forming a uniform pattern, thereby deteriorating the quality of products, decreasing yield and increasing production cost.

SUMMARY OF THE INVENTION

Additional aspects and/or advantages of the invention will be set forth in part in the description which follows and, in part, will be obvious from the description, or may be learned by practice of the invention.

Aspects of the present invention include a mask capable of preventing distortion of a patterned image.

Aspects of the present invention also include a LITI method using the mask.

Aspects of the present invention also include a method of fabricating an organic light emitting display device using the LITI method.

In an aspect of the present invention, a mask for LITI includes patterns arranged in a direction perpendicular to a beam scanning direction, wherein the patterns become longer from the center toward the edge.

According to an aspect of the present invention, when each pattern has a width b, a length d and a laser beam power density h(x, y); the beam scanning direction is y; a direction perpendicular to the beam scanning direction is x; and the center of the pattern in a center region is (0, 0), the pattern centered at x=a has a length p satisfying the following equation $$\int_{-d/2}^{+d/2}\int_{-b/2}^{+b/2} h(x,y)dxdy = \int_{-p/2}^{+p/2}\int_{a-b/2}^{a+b/2} h(x,y)dxdy$$

According to an aspect of the present invention, a gap between center axes of the patterns may become narrower from the center toward the edge.

In another aspect of the present invention, a LITI method includes: preparing a LITI apparatus comprising an optical unit having a laser and a projection lens, and a stage placed under the optical unit; disposing a mask for LITI between the laser and the projection lens, wherein the mask comprises patterns arranged in a direction perpendicular to a beam scanning direction and the patterns become longer from the center toward the edge; and placing a substrate on the stage placed under the optical unit.

According to an aspect of the present invention, the LITI method may further include scanning the substrate in the beam scanning direction of the mask patterns. In addition, the LITI method may further include allowing the optical unit to move in the direction perpendicular to the scanning direction after the scanning, and allowing the laser beam to restart the scanning.

BRIEF DESCRIPTION OF THE DRAWINGS

These and/or other aspects and advantages of the invention will become apparent and more readily appreciated from the following description of the aspects, taken in conjunction with the accompanying drawings of which:

FIG. 2 is a plan view of a patterned substrate of FIGS. 1A and 1B;

DETAILED DESCRIPTION OF THE EMBODIMENTS

Figure 1A:
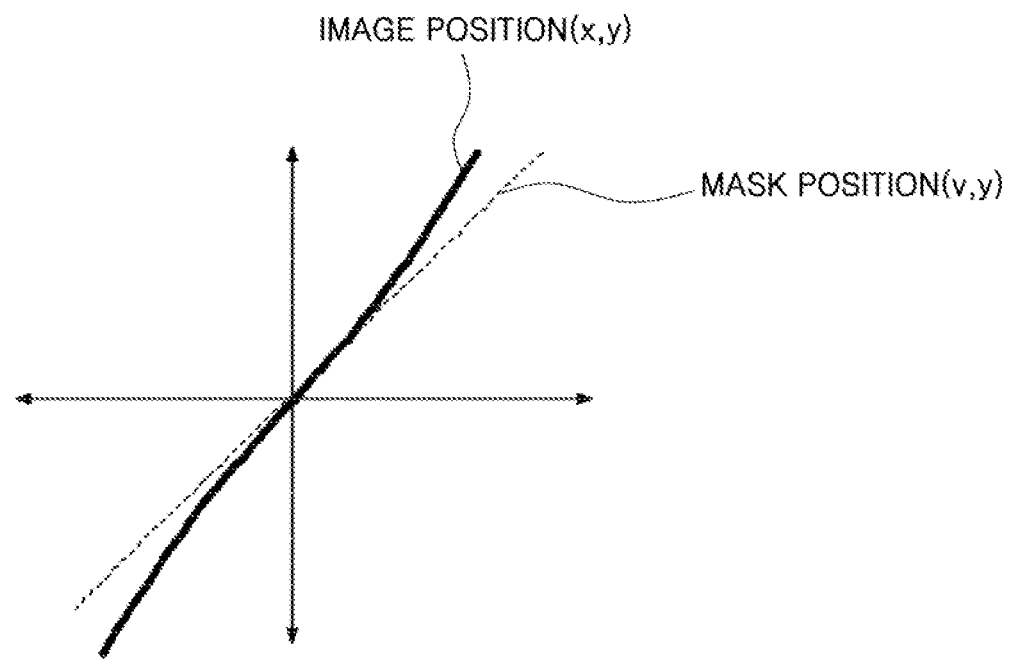
FIG. 1A is a graph showing pattern characteristics according to positions of a substrate with respect to a mask.
Figure 1B:
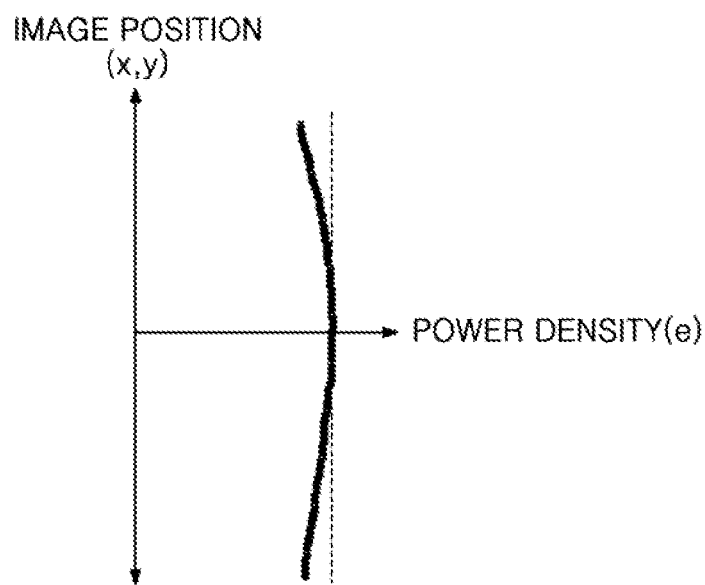
FIG. 1B is a graph showing a power density of a laser beam relative to positions on a substrate.

Reference will now be made in detail to the present aspects of the present invention, examples of which are illustrated in the accompanying drawings, wherein like reference numerals refer to the like elements throughout. The aspects are described below in order to explain the present invention by referring to the figures.

Figure 3:
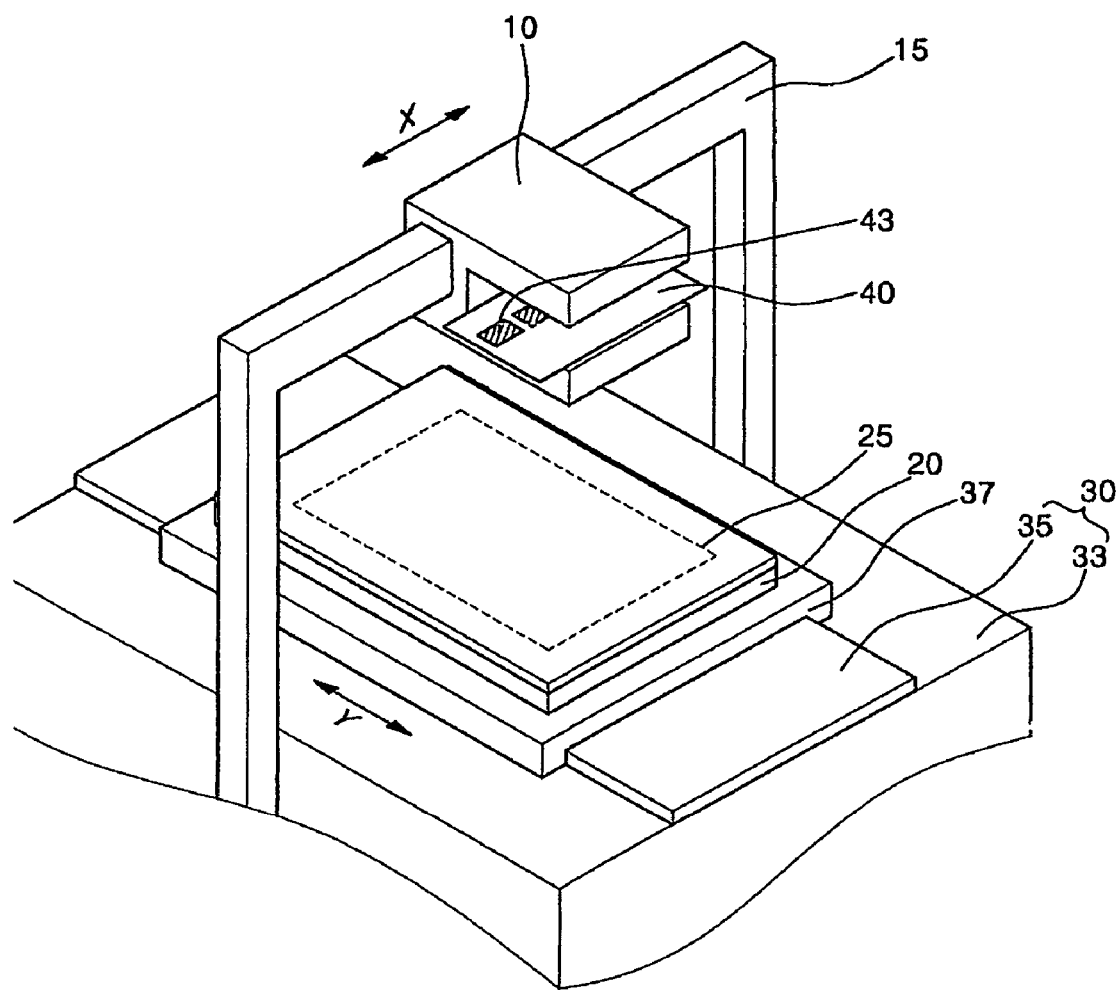
FIG. 3 is a perspective view of a LITI apparatus according to an aspect of the present invention.

FIG. 3 is a perspective view of a Laser Induced Thermal Imaging (LITI) apparatus according to an aspect of the present invention.

Referring to FIG. 3, the LITI apparatus includes an optical unit 10 and a stage 30. The stage 30 is placed under the optical unit 10. The stage 30 also includes a base 33 and a transport plate 35. A chuck 37 is provided on the transport plate 35. The chuck 37 is movable in the Y-axis direction so that a substrate 20 is more efficiently and accurately positioned during LITI.

As shown in FIG. 3, the substrate 20 is placed on the chuck 37 and a donor substrate 25 is placed on the substrate 20. The donor substrate 25 is provided with a transfer layer (not shown) which can be used as an emission layer of an organic light emitting display device.

The optical unit 10 is supported by a supporter 15, and the optical unit 10 is movable along the supporter 15 in the X-axis direction. The optical unit 10 includes a laser and a projection lens (shown in FIG. 4 as numerals 5 and 8, respectively).

Further, a mask 40 is disposed between the projection lens 8 and the laser 5. The mask 40 may have predetermined patterns 43 arranged in one or more rows.

Figure 4:
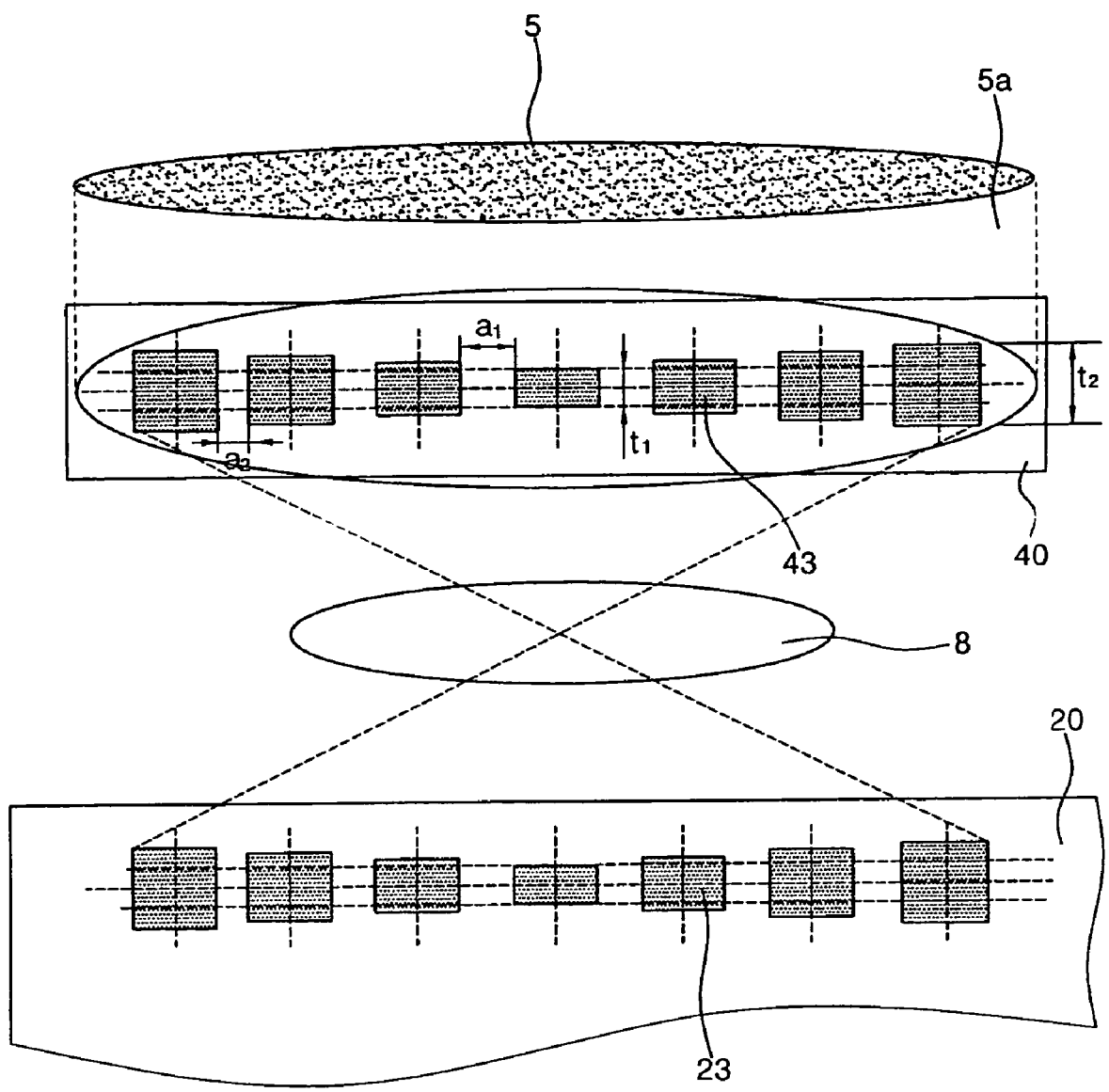
FIG. 4 is a side view showing a mask and an optical unit of the LITI apparatus according to an aspect of the present invention.

FIG. 4 is a side view showing a mask and an optical unit of the LITI apparatus of FIG. 3. Referring to FIGS. 3 and 4, the optical unit 10 includes a laser 5 and a projection lens 8. A beam 5a of a laser 5 is emitted from the laser 5 towards the mask 40, and the beam 5a of the laser 5 that passes through the mask 40 arrives on the substrate 20 placed on the stage 30 via the projection lens 8. Specifically, the laser 5 emits the laser beam 5a. That is, the laser 5 is placed above the mask 40 and emits the laser beam 5a in a direction perpendicular to the mask 40. The laser beam 5a penetrates the projection lens 8 and the mask 40, so that the laser beam 5a is patterned.

The mask 40 is formed with patterns 43 arranged in a direction perpendicular to a beam scanning direction (for example, the X-axis direction in FIG. 3), and the sizes and shapes of the patterns 43 vary depending on their position on the mask 40. For example, the patterns 43 positioned away from the center and towards the edges of the mask 40 have gradually increasing lengths. That is, a length t1 of the pattern 43 located near the center of the mask 40 is different from a length t2 of the pattern 43 near the edge of the mask 40, and the length t2 is longer than the length t1.

Accordingly, even though a beam profile is deformed during a scanning process and the energy of the laser beam 5a becomes reduced in the patterns 43 that are located towards the edges of the mask 40, the reduced energy can be compensated by the enlarged mask patterns on those patterns 43 located near the edge of the mask 40. Thus, the LITI can be applied completely and uniformly to all the areas of the substrate 20 corresponding even to the edge patterns 43 of the mask 40.

Further, spacing between adjacent center axes of the adjacent patterns 43, i.e., between axes that pass through the center of each of the pattern 43 and which are parallel to a lengthwise direction in each of the pattern 43 (shown as vertical dotted lines in FIG. 4) become narrower in the adjacent patterns 43 located towards the edges. Accordingly, the gaps between adjacent edges of the patterns 43 also become narrower in those that are located towards the edges of the mask 40. In other words, a gap a2 between edges of the patterns 43 near the edge is smaller than a gap a1 between the patterns 43 near the center of the mask 40.

Accordingly, a misalignment between the center axes of the patterns 23 on the substrate 20 and the corresponding center axes of the mask patterns 43 is reduced in those patterns 23 and 43 located towards the edges of the substrate 20 or the mask 40 due to the projection lens, so that the entire area of the substrate 20 are scanned and have patterns at proper regular intervals.

Thus, energy is applied uniformly to the substrate 20, and the patterns 23 are formed on the substrate 20 at regular intervals. Accordingly, the LITI apparatus with the mask 40 can improve pattern characteristics without an additional apparatus.

Figure 5A:
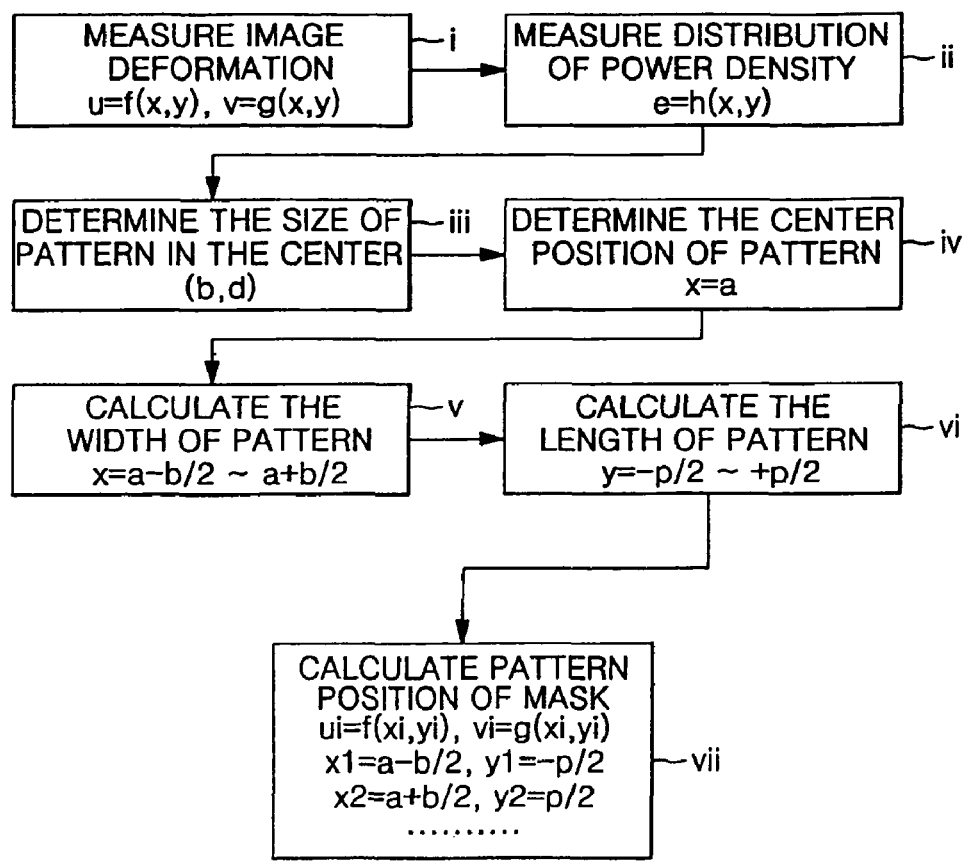
FIGS. 5A and 5B are a diagram and coordinates illustrating a method of fabricating the mask of the LITI apparatus according to an aspect of the present invention, respectively.
Figure 5B:
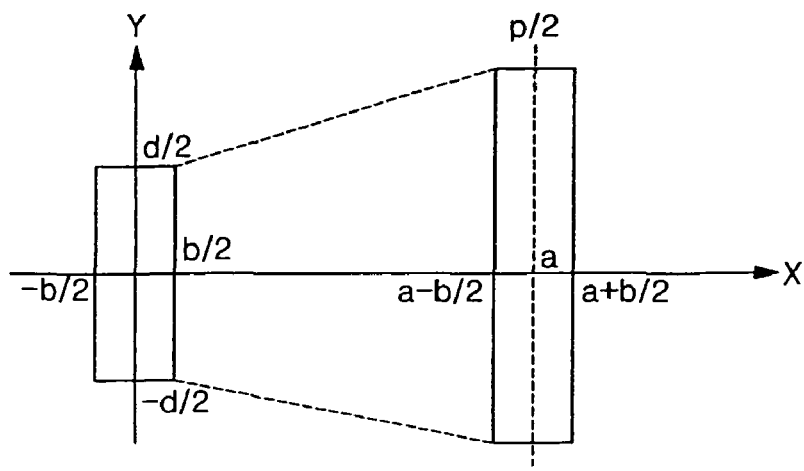

FIG. 5A is a diagram illustrating a method of fabricating a mask of a LITI apparatus according to an aspect of the present invention in terms of a flowchart for forming the patterns 43, and FIG. 5B shows coordinates of patterns on a mask of the LITI apparatus according to an aspect of the present invention.

Referring to FIGS. 5A and 5B, image deformation caused by the projection lens 8 is measured in operation (i). On the assumption that the mask 40 has coordinates (x, y) and an image to be formed on the substrate has coordinates (u, v), image deformation caused by the projection lens 8 can be expressed as functions of the mask coordinates as follows.

$$u=f(x,y), v=g(x,y)$$

Here, since the center (x=0, y=0) of the patterns in a center region of the mask should be coincident with the center (u=0, v=0) of the patterns in a center region of an image, the following conditions are obtained: 0=f(0,0), 0=g(0,0).

Then, the power distribution of the laser beam $5a$ is measured in operation (ii). Here, the power distribution of the laser beam $5a$ can be represented as a ratio of the distribution of the laser beam $5a$ to a median value of the power density distribution due to deformation of the optical unit. Accordingly, the power distribution can be represented as a power density function e=h(x, y). In this case, assuming that the power density at the center (x=0, y=0) of the patterns located in the middle of the mask is 1, the following condition is obtained: 1=h(0, 0).

Then, the center size and the center position of the pattern of the mask are determined respectively in operations (iii) and (iv), and the width of the pattern of the mask is calculated based on the determined size of the pattern in operation (v). For example, assuming that the pattern has a width of "b" and a length of "d" and is located at a position x=0, y=0 on the mask, then the pattern edges will be located at x=b/2 and x=−b/2. If the pattern has a center at x=a, and has a width of "b," then the pattern will be located from x=a−b/2 to x=a+b/2. Then, the length of the pattern is calculated in operation (vi).

Based on the above, the pattern whose center is at y=0 should satisfy the following equation, $$\int_{-d/2}^{+d/2}\int_{-b/2}^{+b/2} h(x,y)dxdy = \int_{-p/2}^{+p/2}\int_{a-b/2}^{a+b/2} h(x,y)dxdy$$

because the total energy of the laser beam passing through patterns centered at x=0, y=0 is $$\int_{-d/2}^{+d/2}\int_{-b/2}^{+b/2} h(x,y)dxdy$$

and the total energy of the laser beam passing through the patterns centered at x=a is $$\int_{-p/2}^{+p/2}\int_{a-b/2}^{a+b/2} h(x,y)dxdy$$

On the basis of the foregoing equation, the length of the pattern centered at x=a, i.e., a length "p", can be calculated in a scanning direction (the length or the Y-axis direction) of the laser beam.

By the foregoing method, the sizes of the patterns located anywhere between the center and the edge of the mask 40 can be calculated in operation (vii), so that the positions and the sizes of the patterns in the mask are defined and determined.

Thus, the mask having the patterns formed by the foregoing process is provided in the LITI apparatus so that image distortion is reduced, thereby improving the quality of products, increasing yield, and decreasing production cost.

Figure 6A:
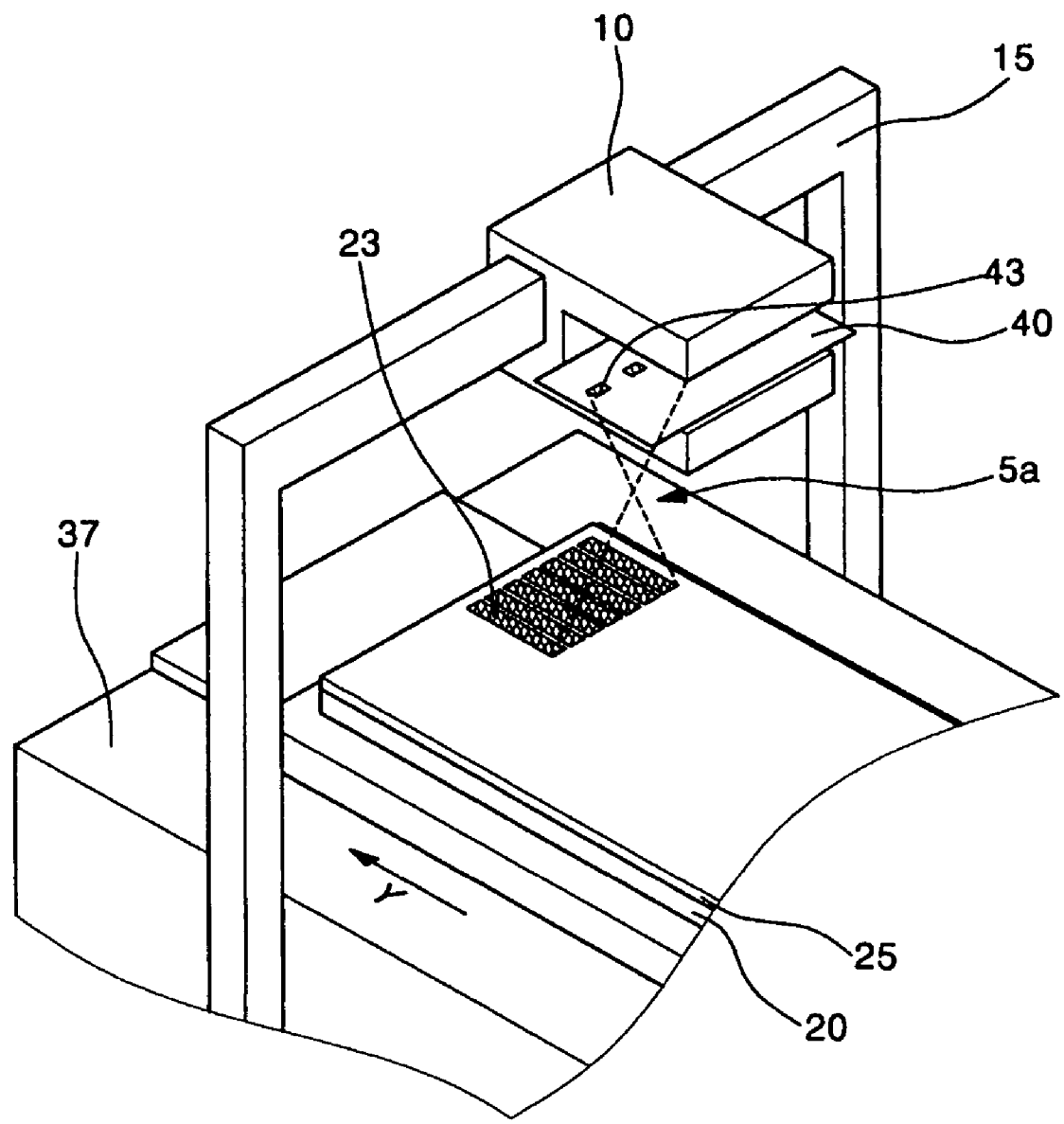
FIGS. 6A and 6B are perspective views illustrating a LITI method according to an aspect of the present invention.
Figure 6B:
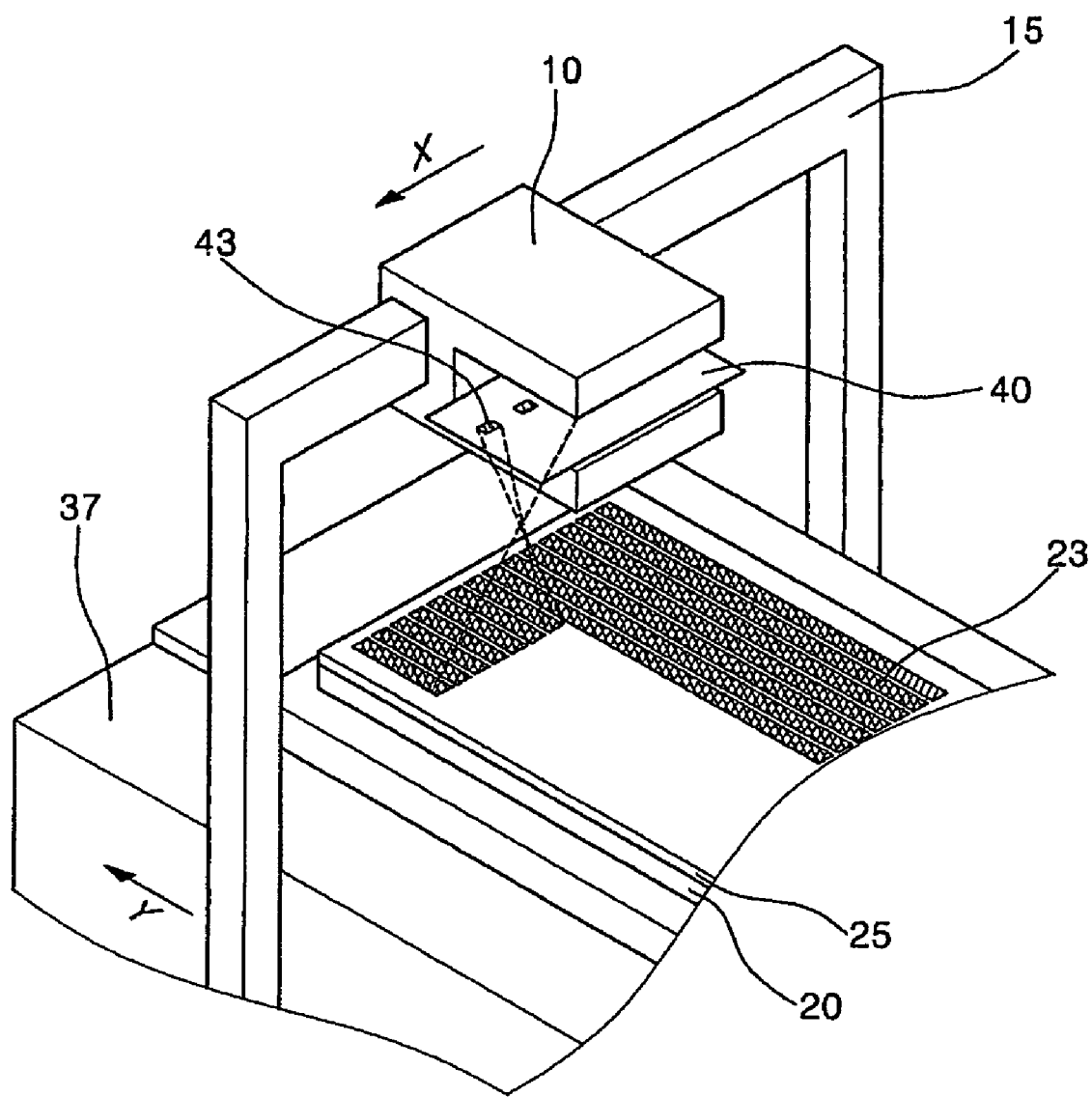

FIGS. 6A and 6B are perspective views illustrating a LITI method according to an aspect of the present invention. Referring to FIG. 6A, first, the LITI apparatus includes an optical unit 10 having a laser and a projection lens. As shown, a stage 30 is placed under the optical unit 10. A mask 40 is disposed between the laser 5 and the projection lens 8 to compensate and/or to ensure the uniform output of the optical unit 10. The mask 40 includes patterns arranged in a direction perpendicular to the beam scanning direction. As shown in FIGS. 4A through 4C, the patterns 43 located towards the edge of the mask 40 are incrementally longer in length than the patterns 43 located in or near the center.

A chuck 37 is placed under the optical unit 10 and is moved on the stage 30. As shown, a substrate 20 is placed on the chuck 37, and a donor substrate 25 having a transfer layer (not shown) is placed on the substrate 20.

After aligning the optical unit 10 with the substrate 20, the optical unit 10 is fixed and a laser beam $5a$ is radiated through the mask pattern 43 while the chuck 37 moves in the Y-axis direction. Therefore, the transfer layer is patterned on the substrate 20 according to the mask patterns 43. Here, the transfer layer patterns 23 may be an emission layer of an organic light emitting display device.

The laser beam $5a$ emitted from the laser 5 scans the substrate 20 in a beam scanning direction Y of the mask pattern 43, thereby patterning the transfer layer. The beam scanning direction Y of the laser beam $5a$ may be a column direction of the pattern 43. That is, while the chuck 37 moves in the beam scanning direction Y at a constant speed, the laser beam $5a$ is imparted with a pattern corresponding to the pattern 43 of the mask 40. Therefore, the transfer layer patterns 23 is patterned as laser beam $5a$ imparted with the pattern scans the substrate 20.

Referring to FIG. 6b, after the scanning operation is completed in the beam scanning direction Y, the optical unit 10 moves in a direction X perpendicular to the beam scanning direction Y. Then, the optical unit 10 and the substrate 20 are aligned with each other, and the scanning is performed again by the method shown in FIG. 5A.

Figure 6C:
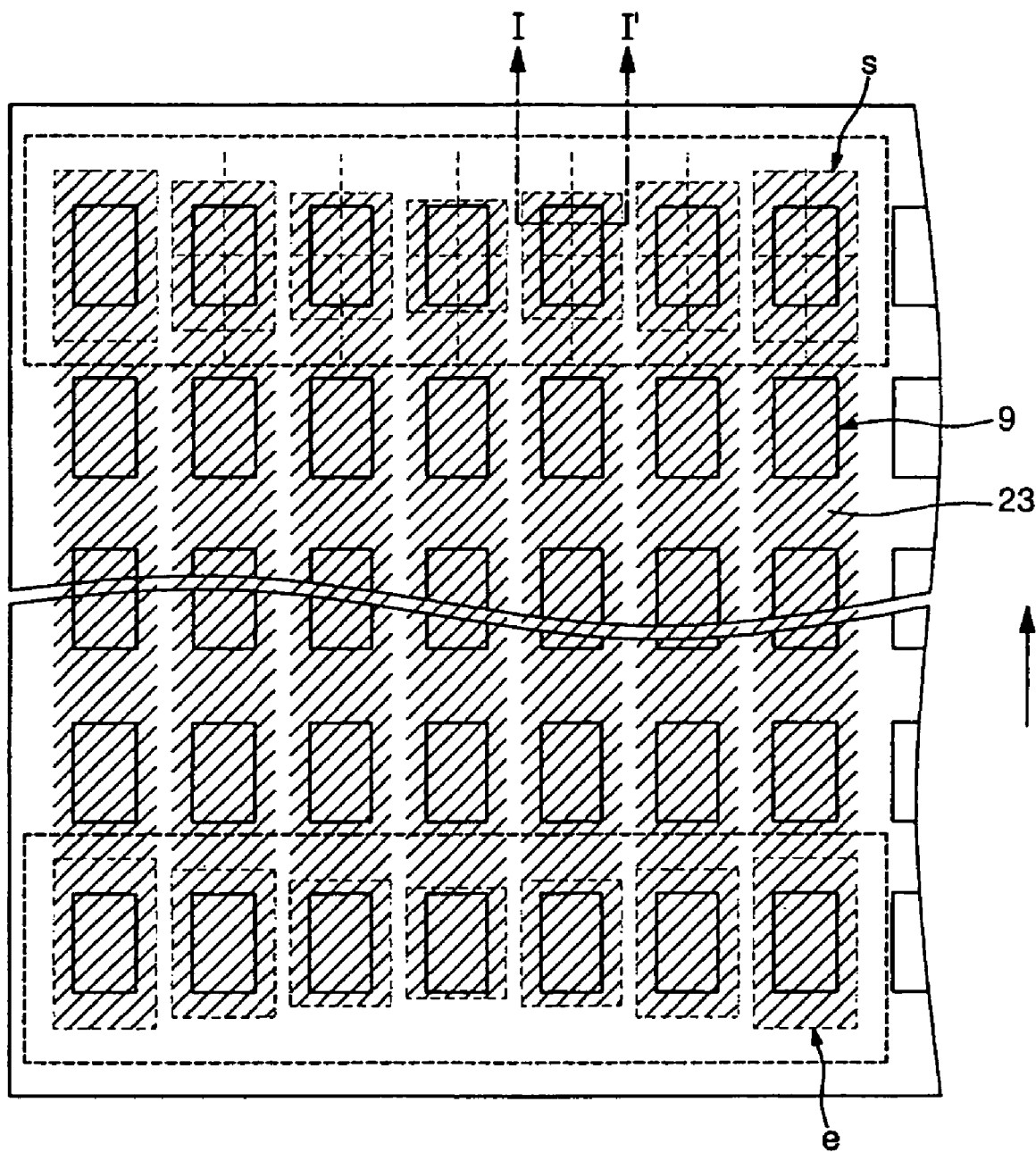
FIG. 6C is a plan view of a patterned substrate according to an aspect of the present invention.

FIG. 6C is a plan view partially illustrating a patterned substrate according to an aspect of the present invention. Referring to FIG. 6C, the transfer layer patterns 23 patterned by the method shown in FIGS. 6A and 6B is formed having a stripe shape in an emission region 9 of each unit pixel. The patterns 23 entirely cover the emission region 9, and are patterned without variation or misalignment of the center positions. Further, the laser energy is uniformly applied to all patterns 23 at an initial point (s) and an ending point (e) of the patterning, so that the transfer layer patterns 23 can be patterned with uniformity in every unit pixel.

Figure 7:
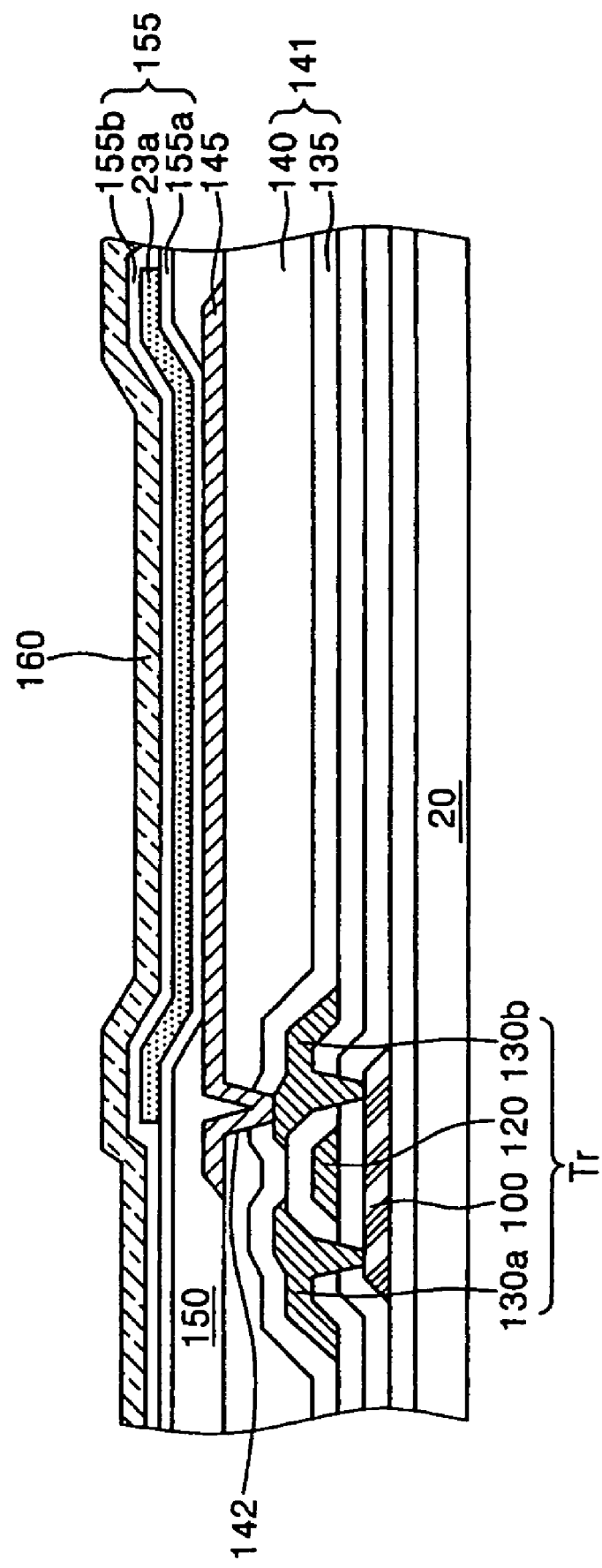
FIG. 7 is a cross-sectional view of an organic light emitting display device fabricated according to an aspect of the present invention.

FIG. 7 is a cross-sectional view of an organic light emitting display device fabricated according to an aspect of the present invention, taken along line I-I' of FIG. 6C Referring to FIG. 7, a pixel electrode 145 is formed on a substrate 20. Before the pixel electrode 145 is formed, the substrate 20 is provided with a thin film transistor Tr per unit pixel. The thin film transistor Tr includes a semiconductor layer 100, a gate electrode 120, a source electrode 130a, and a drain electrode 130b, formed on the substrate 20.

Then, an insulating layer 141 is formed on the substrate 20 that includes the thin film transistor Tr. The insulating layer 141 can be formed of an inorganic layer, an organic layer or a stacked layer thereof. For example, the insulating layer 141 can be formed of an inorganic passivation layer 135, an organic passivation layer 140, and a stacked layer thereof.

A via hole 142 is formed in the insulating layer 141 to expose the source electrode 130a or the drain electrode 130b. Then, a conductive layer is formed on the insulating layer 141 and then patterned to form the pixel electrode 145. Further, an insulating layer can be formed on the substrate 20 having the pixel electrode 145 and then patterned, thereby forming a pixel defining layer 150 to partially expose the pixel electrode 145.

Referring back to FIG. 3, the substrate 20 having the pixel electrode 145 is positioned opposite to and laminated with the donor substrate 25 having the transfer layer. Then, the laminated substrate 20 is placed on the chuck 37. Then, the transfer layer patterns 23 are is patterned on the substrate 20 by the method shown in FIGS. 6A and 6B.

Referring back to FIG. 7, the transfer layer pattern 23 may be an emission layer 23a. Further, charge injection layers or charge transport layers may be formed on or under the emission layer 23aa. For example, a hole injection or transport layer 155a can be formed under the emission layer 23a, and an electron injection or transport layer 155b can be formed on the emission layer 23a. That is, an organic layer 155 including the emission layer 23a can be formed on the pixel electrode 145. After forming a counter electrode 160 on the substrate 20 having the patterned emission layer 23a, the substrate 20 is encapsulated, thereby completing the organic light emitting display device.

As described above, aspects of the present invention include a mask for LITI and a LITI method using the same, in which the mask for uniformly applying power density of a laser to each pattern is used, so that a transfer layer can be patterned with uniform characteristics. Thus, a LITI apparatus can improve pattern characteristics without an additional apparatus.

Further, aspects of the present invention include a mask for LITI and a LITI method using the same, in which the mask for compensating the uniformity of a projection lens is used, so that leaning of image patterns formed on a substrate towards the edge is reduced.

Although a few aspects of the present invention have been shown and described, it would be appreciated by those skilled in the art that changes may be made in this aspect without departing from the principles and spirit of the invention, the scope of which is defined in the claims and their equivalents.

What is claimed is:

1. A mask for laser induced thermal imaging (LITI), comprising patterns arranged in a direction perpendicular to a beam scanning direction, such that increasingly longer patterns are located towards the edges of the mask than in or near the center of the mask.

2. The mask according to claim 1, wherein when each pattern has a width b, a laser beam power density h(x, y), a beam scanning direction-y, a direction x perpendicular to the beam scanning direction, and a center of the pattern in a center region (0, 0) and its length d, then the pattern centered at x=a has a length p satisfying the following equation $$\int_{-d/2}^{+d/2}\int_{-b/2}^{+b/2}h(x,y)dxdy = \int_{-p/2}^{+p/2}\int_{a-b/2}^{a+b/2}h(x,y)dxdy.$$

3. The mask according to claim 1, wherein the patterns are used to pattern an emission layer of an organic light emitting display device.

4. The mask according to claim 1, wherein the distance between center axes of adjacent patterns is incrementally reduced, from the center of the mask to the edges of the mask.

5. The mask according to claim 1, wherein the distance between adjacent edges of the patterns is incrementally reduced, from the center of the mask to the edges of the mask.

6. The mask according to claim 1, wherein when the mask is used with substrate patterns having center axes corresponding to the center axes of the patterns, misalignment between center axes of substrate patterns and the corresponding center axes of the patterns of the mask is reduced in the substrate patterns and the patterns of the mask that are located towards the edges of a substrate or the mask.

7. A laser induced thermal imaging (LITI) method using a LITI apparatus comprising an optical unit having a laser and a projection lens, and a stage placed under the optical unit, the method comprising:
   disposing a mask for the LITI apparatus between the laser and the projection lens, wherein the mask comprises patterns arranged in a direction perpendicular to a beam scanning direction, such that increasingly longer patterns are located towards the edges of the mask than in or near the center of the mask; and
   placing a substrate on the stage placed under the optical unit.

8. The LITI method according to claim 7, further comprising a laser beam scanning the substrate in the beam scanning direction of the mask patterns after placing the substrate on the stage.

9. The LITI method according to claim 8, further comprising moving the optical unit in the direction perpendicular to the scanning direction after the scanning operation, and the laser beam performing another scanning.

10. The LITI method according to claim 7, wherein when each pattern has a width b, a laser beam power density h(x, y), a beam scanning direction-y, a direction x perpendicular to the beam scanning direction, and a center of the pattern in a center region (0, 0) and its length d, then the pattern centered at x=a in the mask has a length p satisfying the following equation:

$$\int_{-d/2}^{+d/2}\int_{-b/2}^{+b/2}h(x,y)dxdy = \int_{-p/2}^{+p/2}\int_{a-b/2}^{a+b/2}h(x,y)dxdy.$$

11. The LITI method according to claim 7, wherein the distance between center axes of adjacent patterns is incrementally reduced, from the center of the mask to the edges of the mask.

12. The LITI method according to claim 7, further comprising placing a donor substrate having a transfer layer on the substrate.

13. The LITI method according to claim 12, wherein the transfer layer is used as an emission layer of an organic light emitting display device.

14. A mask for use with laser induced thermal imaging (LITI) apparatus, the mask comprising:
   a first pattern not located in a center of the mask; and
   a second pattern located in or near the center of the mask so that the amount of light passing through the first and second patterns are equal,
   wherein when each pattern has a width b, a laser beam power density h(x, y), a beam scanning direction y, a direction x perpendicular to the beam scanning direction; and a center of the second pattern in a center region (0, 0) and its length d, then the first pattern having centered at x=a in the mask has a length p satisfying the following equation:

$$\int_{-d/2}^{+d/2}\int_{-b/2}^{+b/2}h(x,y)dxdy = \int_{-p/2}^{+p/2}\int_{a-b/2}^{a+b/2}h(x,y)dxdy.$$

15. The mask according to claim 14, wherein the length d is shorter than length p.

* * * * *